US012727118B2

(12) United States Patent
Pan et al.

(10) Patent No.: US 12,727,118 B2
(45) Date of Patent: Sep. 1, 2026

(54) WATER-COOLING HEAT DISSIPATION DEVICE

(71) Applicant: KUAN DING INDUSTRIAL CO., LTD., New Taipei City (TW)

(72) Inventors: Kuan-Da Pan, New Taipei City (TW); Ming-Cheng Peng, New Taipei City (TW)

(73) Assignee: KUAN DING INDUSTRIAL CO., LTD., New Taipei City (TW)

(*) Notice: Subject to any disclaimer, the term of this patent is extended or adjusted under 35 U.S.C. 154(b) by 132 days.

(21) Appl. No.: 18/949,126

(22) Filed: Nov. 15, 2024

(65) Prior Publication Data

US 2025/0386454 A1 Dec. 18, 2025

(30) Foreign Application Priority Data

Jun. 18, 2024 (TW) ................................ 113122556

(51) Int. Cl.
*H05K 7/20* (2006.01)

(52) U.S. Cl.
CPC ..... *H05K 7/20272* (2013.01); *H05K 7/20263* (2013.01)

(58) Field of Classification Search
CPC ........... H05K 7/20272; H05K 7/20263; H05K 7/20254; H05K 7/20872
See application file for complete search history.

(56) References Cited

U.S. PATENT DOCUMENTS 10,785,892 B1* 9/2020 Chen .................. H05K 7/20281
2009/0218072 A1* 9/2009 Eriksen ..................... G06F 1/20 165/80.2
2016/0363967 A1* 12/2016 Tsai ................... H05K 7/20272
2017/0212560 A1* 7/2017 Tsai .......................... G06F 1/20
2017/0215301 A1* 7/2017 Zheng ....................... G06F 1/20
2017/0339802 A1* 11/2017 Pan .................... H05K 7/20263
(Continued)

FOREIGN PATENT DOCUMENTS

CN 117666735 A 3/2024
TW M634997 U 12/2022
TW M636825 U 1/2023

OTHER PUBLICATIONS

Office Action dated Jan. 14, 2025 of the corresponding Taiwan patent application No. 113122556.

*Primary Examiner* — Travis Ruby

(74) *Attorney, Agent, or Firm* — HDLS IPR SERVICES; Chun-Ming Shih

(57) ABSTRACT

A water-cooling heat dissipation device (1), which includes: a base (10) having an accommodation space (11), a heat exchanging chamber (12) having a circular slot (15) and a first pipe member (13), a water conveying pipe (14) communicates with the accommodation space (11) and the heat exchanging chamber (12); a heat absorbing structure (20) disposed in the heat exchanging chamber (12); a liquid driving mechanism (30) disposed in the accommodation space (10) and having a housing (31) and a rotor assembly (32), the housing (31) has a compartment (311), a second pipe member (312) and a third pipe member (313); and a seal member (40) disposed in the circular slot (15) and squeezed by the third pipe member (313) to generate a partial deformation to make the third pipe member (313) be tightly combined with the water conveying pipe (14).

10 Claims, 6 Drawing Sheets

(56) References Cited

U.S. PATENT DOCUMENTS

| | | | | |
|---|---|---|---|---|
| 2018/0023594 | A1* | 1/2018 | Sheng | F04D 1/06 165/104.31 |
| 2020/0344912 | A1* | 10/2020 | Lai | H05K 7/20254 |
| 2020/0396866 | A1* | 12/2020 | Chen | H05K 7/20254 |
| 2022/0170705 | A1* | 6/2022 | Huang | F28D 1/05375 |
| 2022/0196507 | A1* | 6/2022 | Subrahmanyam | H05K 7/2079 |
| 2022/0373275 | A1 | 11/2022 | Mostafavi Yazdi et al. | |
| 2023/0041886 | A1* | 2/2023 | Mark | G06F 1/20 |
| 2023/0168726 | A1* | 6/2023 | Chen | G06F 1/20 |
| 2023/0324124 | A1* | 10/2023 | Liang | H10W 40/47 165/47 |
| 2023/0417602 | A1* | 12/2023 | Curtis | H05K 7/20272 |
| 2024/0003359 | A1* | 1/2024 | Yeh | F04D 13/064 |
| 2024/0074100 | A1* | 2/2024 | Saksager | G06F 1/20 |
| 2024/0074105 | A1* | 2/2024 | Tsai | F04D 29/4293 |
| 2024/0077258 | A1* | 3/2024 | Xiao | F28D 15/00 |

* cited by examiner 1
50
32
321
33
34
30
314
315
317
316
31
312
311
70
421
42
43
40
431
41
16
15
14
11
10
18
60
17
13
20

WATER-COOLING HEAT DISSIPATION DEVICE

BACKGROUND OF THE DISCLOSURE

Technical Field

The present disclosure relates to a heat dissipation technology field, especially to a water-cooling heat dissipation device.

Description of Related Art

The calculating speed of components, for example a processor, in an electronic product has been being increased, and the generated heat also becomes greater, thus an air-cooling heat dissipation device is unable to satisfy the current heat dissipating requirements. Accordingly, a related-art water-cooling heat dissipation device with a water-cooling circulating function is required to effectively dissipate the heat generated by the aforesaid electronic device.

The related-art water-cooling heat dissipation device solves a lot of problems existed in the air-cooling heat dissipation device, and the heat dissipating performance of the heat dissipation device is greatly increased. However, the related-art water-cooling heat dissipation device still has disadvantages, for example liquid leaking and poor airtight effect, to be improved.

Accordingly, the applicant of the present disclosure has devoted himself for improving the mentioned shortages.

SUMMARY OF THE INVENTION

The present disclosure provides a water-cooling heat dissipation device, which has advantages of making a water conveying pipe be provided with a desirable airtight effect to effectively prevent a liquid from leaking.

Accordingly, the present disclosure provides a water-cooling heat dissipation device, which includes a base, a heat absorbing structure, a liquid driving mechanism and a seal member. The base includes an accommodation space, a heat exchanging chamber and a first pipe member communicating with the heat exchanging chamber. A water conveying pipe is disposed between the accommodation space and the heat exchanging chamber and in communication with the accommodation space and the heat exchanging chamber. A circular slot is formed at an outer periphery of the water conveying pipe. The heat absorbing structure is connected to the base and disposed in the heat exchanging chamber. The liquid driving mechanism is connected to the base and disposed in the accommodation space. The liquid driving mechanism includes a housing and a rotor assembly. The housing includes a compartment, a second pipe member communicating with the compartment and a third pipe member communicating with the compartment. The rotor assembly is disposed in the compartment. The third pipe member is disposed in the circular slot and in communication with the water conveying pipe. The seal member is disposed in the circular slot and squeezed by the third pipe member to generate a partial deformation; thus, the third pipe member is tightly combined with the water conveying pipe. The seal member includes a bottom pad, an inner ring and an outer ring extended from the bottom pad. The inner ring is clamped between the water conveying pipe and the third pipe member. The bottom pad is abutted by the third pipe member. The outer ring is clamped between the third pipe member and an inner wall of the circular slot.

Advantages achieved by the present disclosure are as follows. The whole structure of the present disclosure is more compact with the arrangement of each component; thus, a higher heat dissipating performance is provided. With the double ring structural design having the inner ring and the outer ring, a better tight combing effect and a better anti-leaking effect are provided. With the first pipe member and the base being configured in one piece and the second pipe member and the housing being configured in one piece, an effect of greatly preventing the liquid from leaking is provided.

BRIEF DESCRIPTION OF THE DRAWINGS

Figure 1:
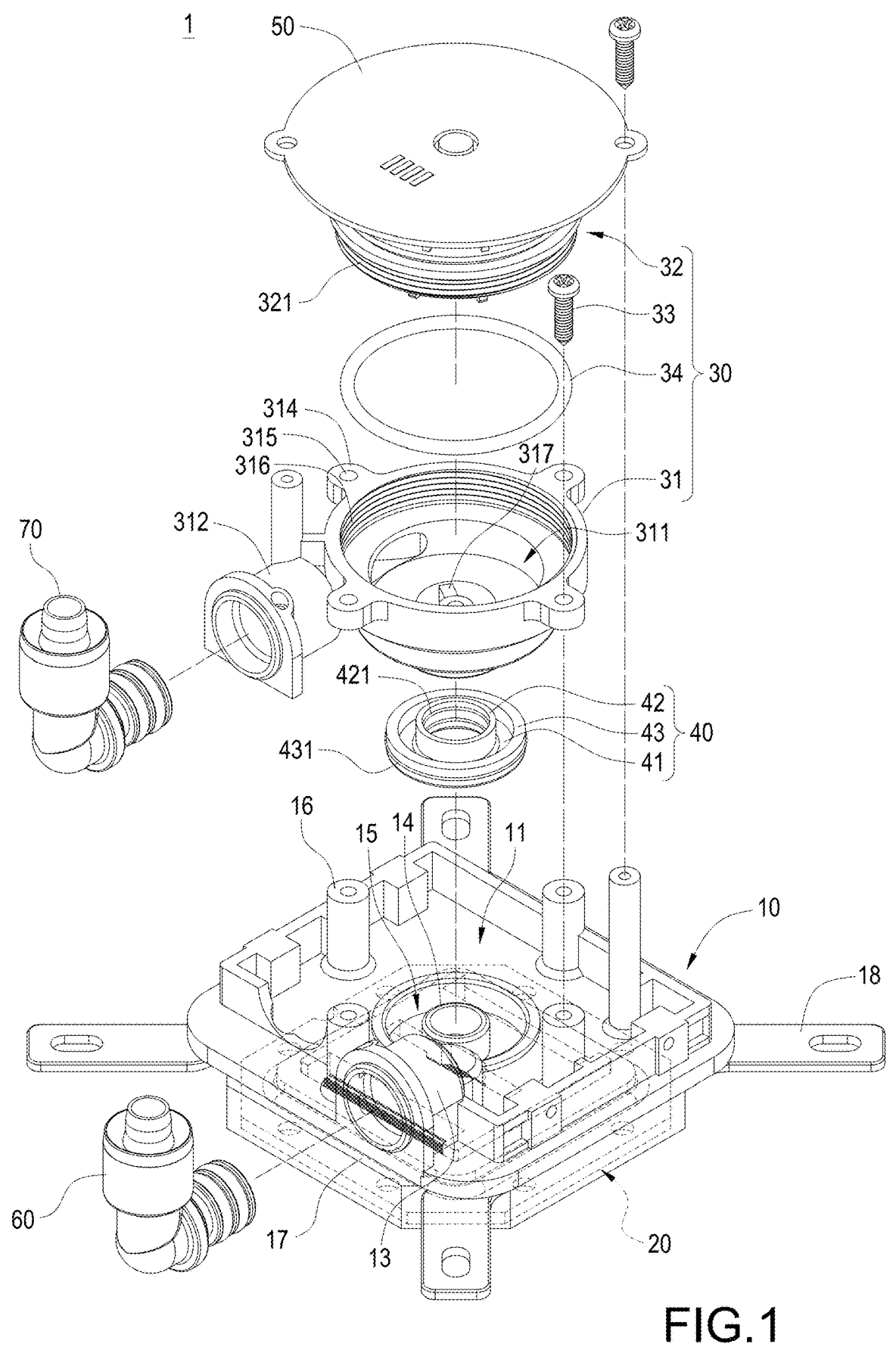

FIG. 1 is an exploded view showing the water-cooling heat dissipation device according to the present disclosure;

DETAILED DESCRIPTION

Figure 2:
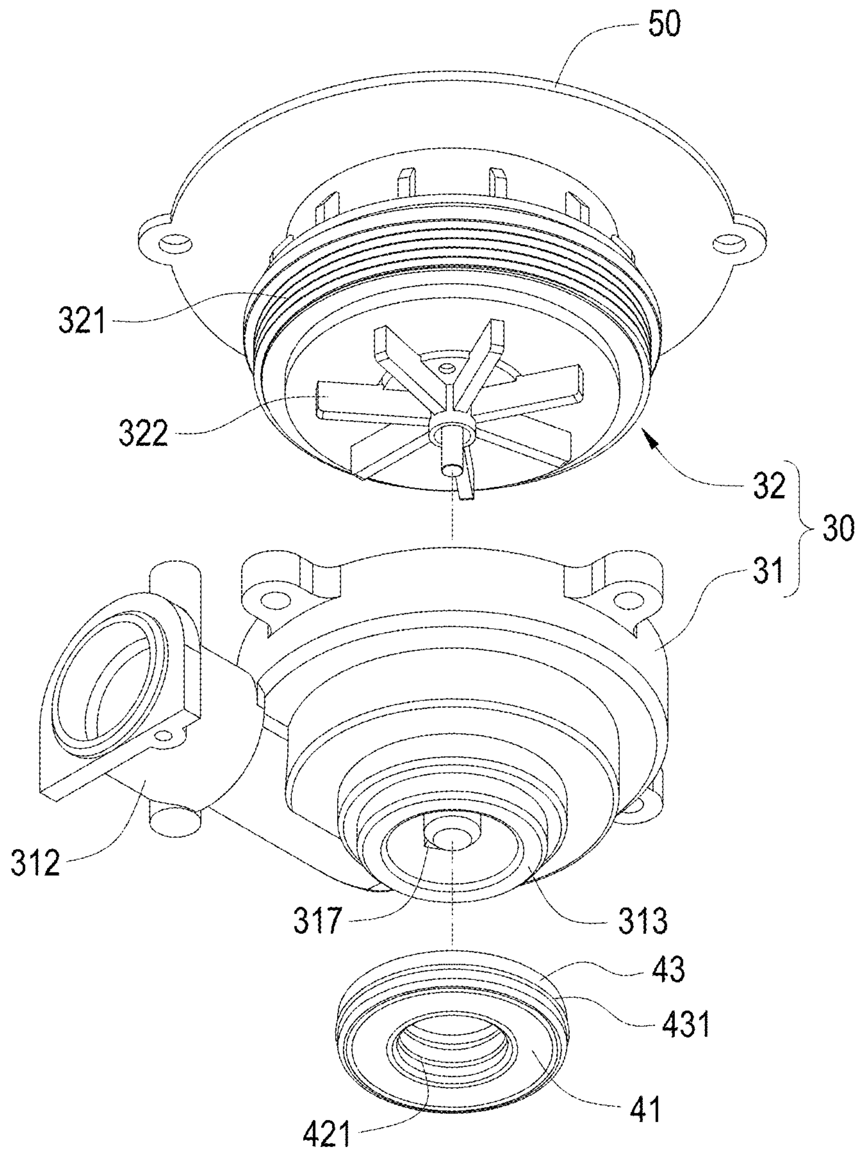
FIG. 2 is an exploded view showing the liquid driving mechanism and the seal member according to the present disclosure.
Figure 3:
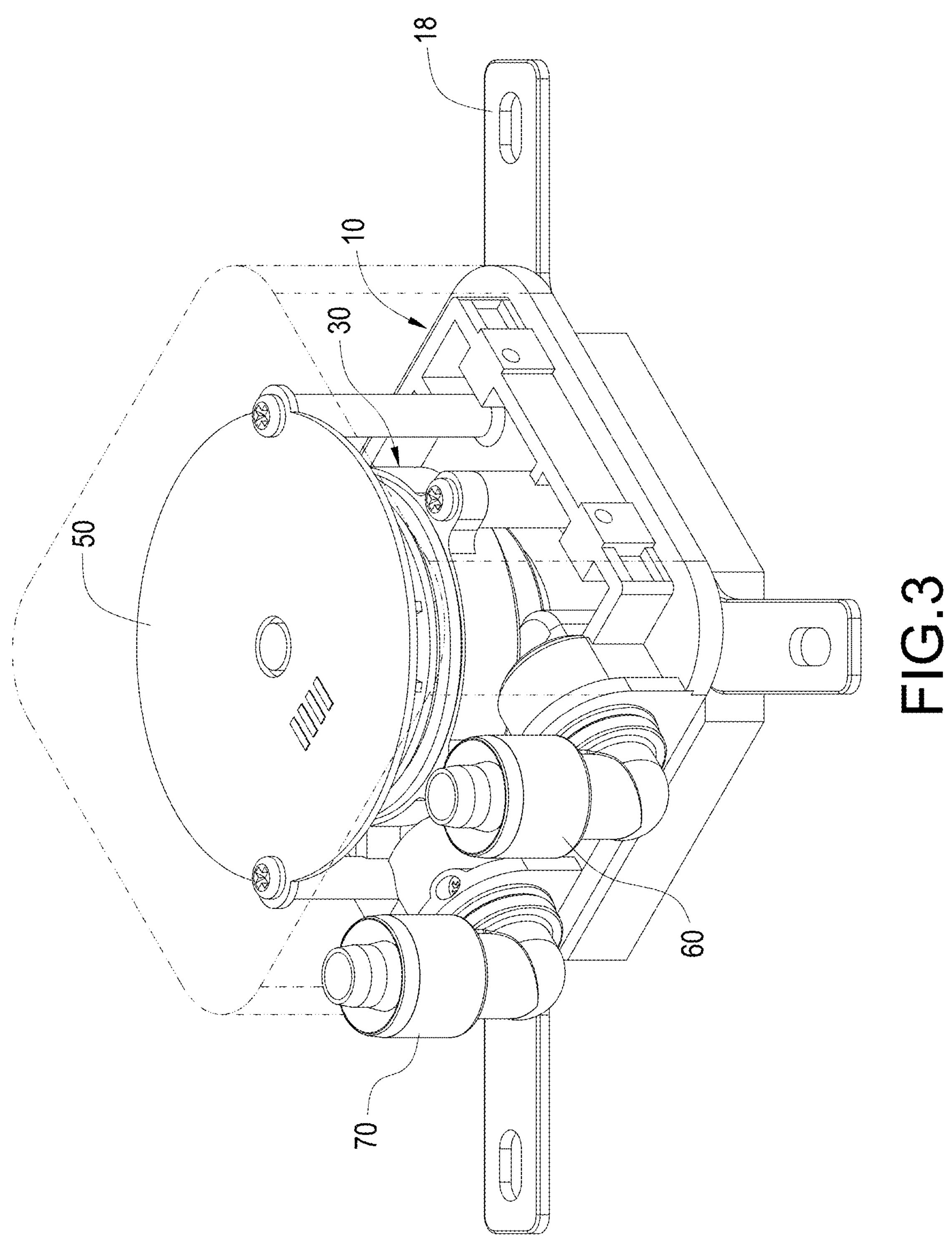
FIG. 3 is a perspective view showing the assembly of the water-cooling heat dissipation device according to the present disclosure.

The technical contents of this disclosure will become apparent with the detailed description of embodiments accompanied with the illustration of related drawings as follows. It is intended that the embodiments and drawings disclosed herein are to be considered illustrative rather than restrictive.

Please refer from FIG. 1 to FIG. 5, the present disclosure provides a water-cooling heat dissipation device. According to one embodiment, the water-cooling heat dissipation device 1 mainly includes a base 10, a heat absorbing structure 20, a liquid driving mechanism 30 and a seal member 40.

The base 10 is substantially formed as a rectangular member. The base 10 includes an accommodation space 11, a heat exchanging chamber 12 and a first pipe member 13. The accommodation space 11 is formed at a top portion of the base 10. The heat exchanging chamber 12 is disposed at a lower portion of the base 10. The first pipe member 13 and the base 10 are configured in one piece (or formed integrally). The first pipe member 13 communicates with the heat exchanging chamber 12. A water conveying pipe 14 is disposed between the accommodation space 11 and the heat exchanging chamber 12, and in communication with the accommodation space 11 and the heat exchanging chamber 12. A circular slot 15 is formed at an outer periphery of the water conveying pipe 14.

Figure 4:
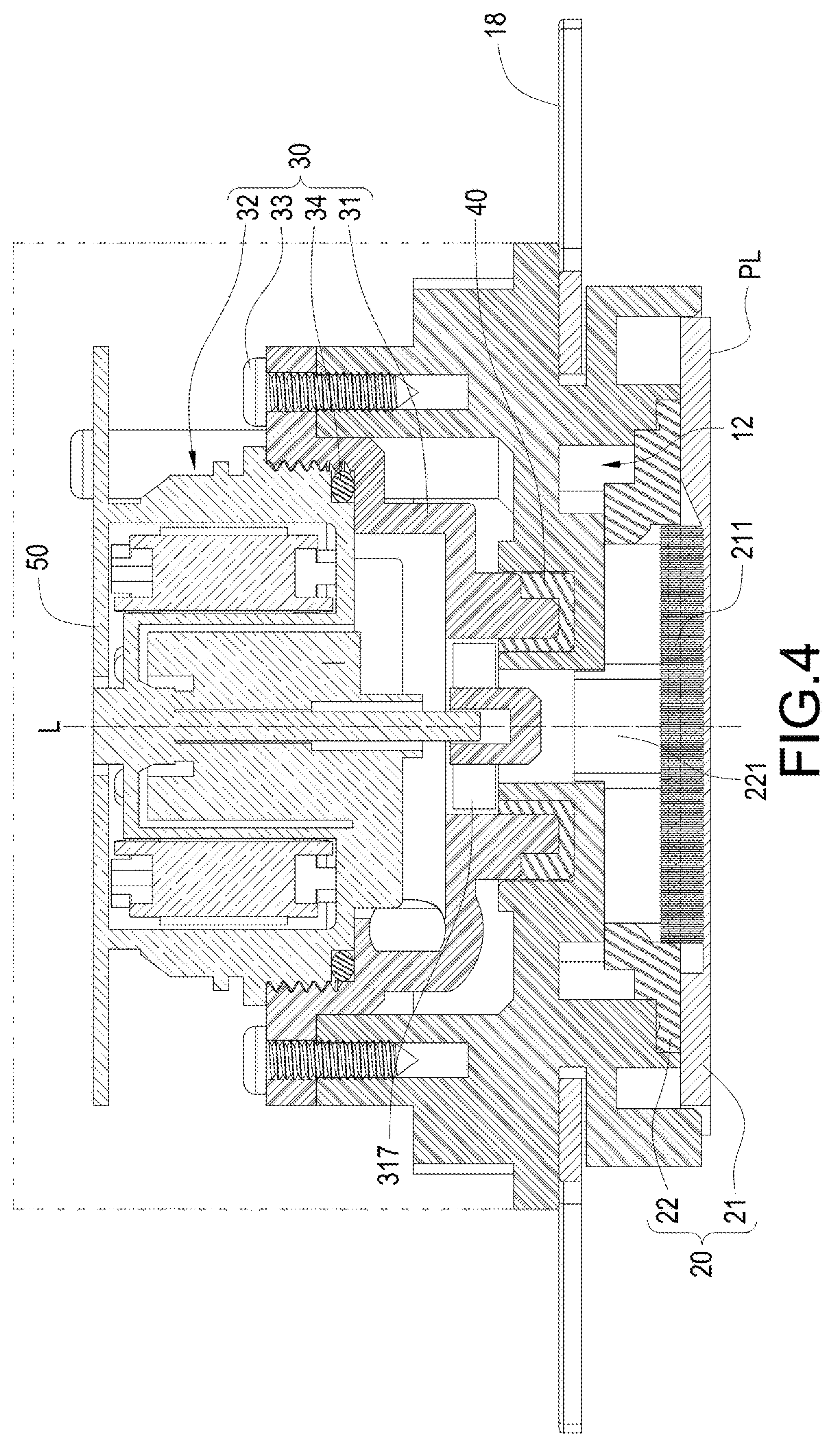
FIG. 4 is a cross-sectional view showing the assembly of the water-cooling heat dissipation device according to the present disclosure.
Figure 5:
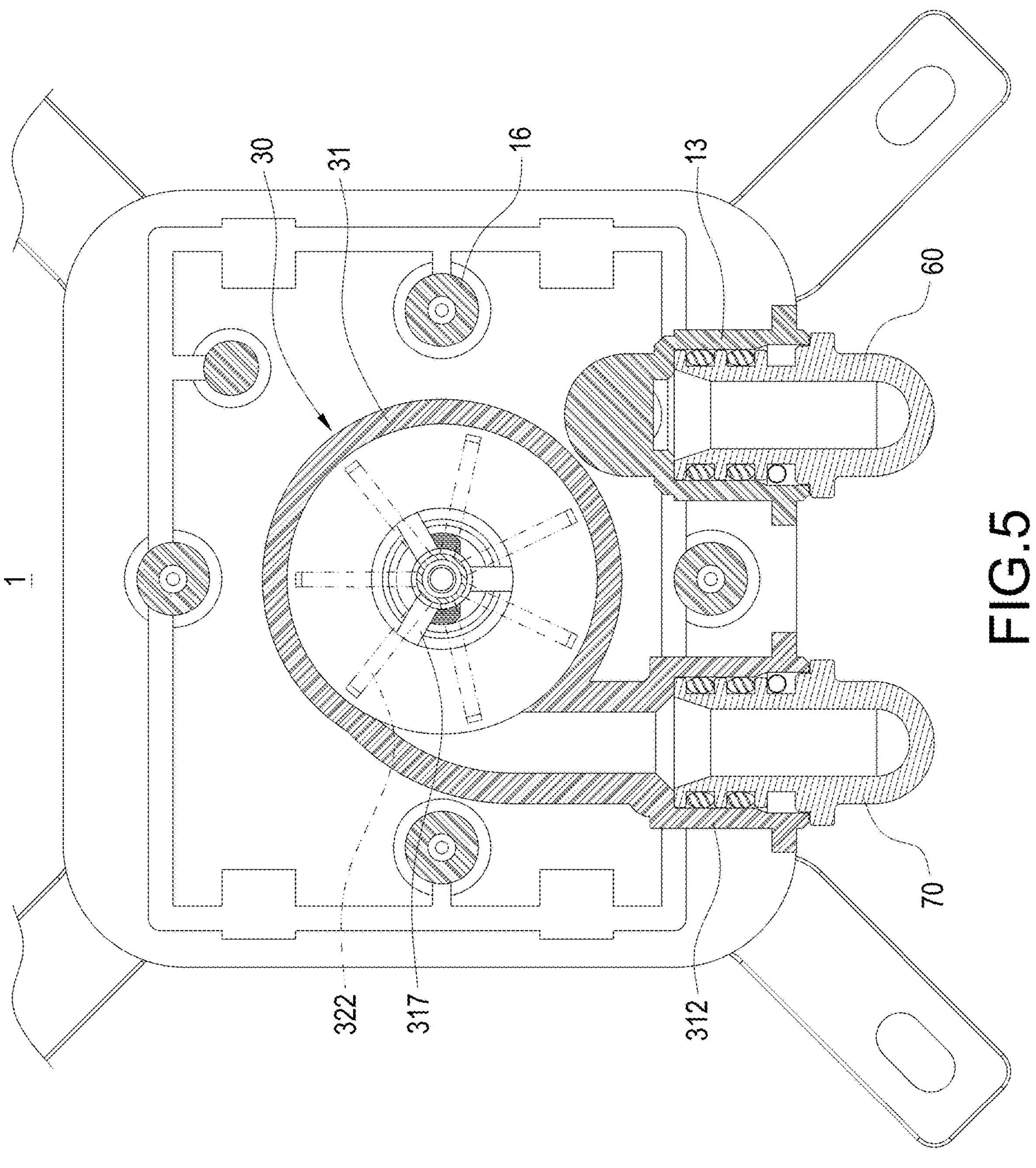
FIG. 5 is a cross-sectional view showing the water-cooling heat dissipation device according to the present disclosure.

The heat absorbing structure 20 is connected to the base 10 and disposed in the heat exchanging chamber 12. The heat absorbing structure 20 mainly includes a heat conducting plate 21 and an inner cover 22. The heat conducting plate 21 is made of a material having a desirable heat conducting performance, for example copper, aluminum, magnesium or an alloy thereof. A plurality of heat dissipating fins 211 are disposed at an inner side of the heat conducting plate 21 and spaced apart, as shown in FIG. 4. The inner cover 22 correspondingly covers on top of each of the heat dissipating fins 211. The inner cover 22 has an opening 221. The opening 221 is disposed corresponding to the water conveying pipe 14.

The liquid driving mechanism 30 is connected to the base 10 and disposed in the accommodation space 11. The liquid driving mechanism 30 mainly includes a housing 31 and a rotor assembly 32. The housing 31 includes a compartment 311, a second pipe member 312 communicating with the compartment 311 and a third pipe member 313 communicating with the compartment 311. The second pipe member 312 and the housing 31 are configured in one piece (or formed integrally). The rotor assembly 32 is disposed in the compartment 311. The third pipe member 313 is disposed in the circular slot 15 and in communication with the water conveying pipe 14. The rotor assembly 32 includes an impeller 322, a rotor and a stator. The compartment 311 has a top compartment and a bottom compartment located below the top compartment. The stator is disposed in the top compartment. The rotor and the impeller 322 are disposed in the bottom compartment.

The seal member 40 is disposed in the circular slot 15 and clamped between the water conveying pipe 14 and the third pipe member 313. After the seal member 40 has been clamped by the third pipe member 313 and the water conveying pipe 14, the third pipe member 313 is tightly combined with the water conveying pipe 14 by the seal member 40 being partially deformed due to the dimension tolerance.

The seal member 40 is disposed in the circular slot 15 and squeezed by the third pipe member 313 to generate a partial deformation, thus the third pipe member 313 is tightly combined with the water conveying pipe 14. The seal member 40 includes a bottom pad 41, an inner ring 42 and an outer ring 43 upwardly extended from the bottom pad 41. The inner ring 42 is clamped between the water conveying pipe 14 and the third pipe member 313. The bottom pad 41 is abutted by a front end surface of the third pipe member 313. The outer ring 43 is clamped between the third pipe member 313 and an inner wall of the circular slot 15.

In some embodiments, the bottom pad 41, the inner ring 42 and the outer ring 43 covers a distal end of the third pipe member 313. A longitudinal height of the inner ring 42 may be greater than, equal to or smaller than a longitudinal height of the outer ring 43 according to actual designs. A surface at one side of the inner ring 42 opposite to the outer ring 43 has at least one inner side water stopping ring 421. A surface at one side of the outer ring 43 opposite to the inner ring 42 has at least one outer side water stopping ring 431. With the double ring structural design having the inner ring 42 and the outer ring 43 provided to the seal member 40, a direct inserting manner is used for tightly combing during the installation, thus the combination is easier and simplified, and the direct inserting manner is more practical comparing to the latching or screwing manner.

In some embodiments, the first pipe member 13 is a water inlet pipe or a water outlet pipe, which is determined by a rotating direction of the rotor assembly 32. The second pipe member 312 is a water inlet pipe or a water outlet pipe, and a flowing direction thereof is opposite to a flowing direction of the first pipe member 13.

In some embodiments, the accommodation space 11 of the base 10 is disposed with a plurality of screw bolts 16. The housing 31 is substantially formed as a cylindrical member. A plurality of lugs 314 are extended from a circumference of the housing 31. Each of the lugs 314 has a penetrated hole 315. The housing 31 is fastened with the base 10 by a plurality of screw members 33 penetrating each of the penetrated holes 315 and each of the screw bolts 16.

In some embodiments, an insertion slot 17 is disposed at a middle area defined at an outer side of the base 10 to make a fastening rack 18 be mounted and connected.

In some embodiments, the housing 31 has an inner thread 316. The rotor assembly 32 has an outer thread 321. The rotor assembly 32 is fastened with the housing 31 by the outer thread 321 being threaded with the inner thread 316.

In some embodiments, the liquid driving mechanism 30 further includes an anti-leaking ring 34. The anti-leaking ring 34 is clamped between the housing 31 and the rotor assembly 32.

In some embodiments, the heat conducting plate 21 of the heat absorbing structure 20 has an abutting plane PL. The abutting plane PL is attached and in communication with a heat generating source (not shown in figures). The rotor assembly 32 has a core extending line L. The core extending line L is perpendicular to the abutting plane PL.

In some embodiments, the housing 31 further includes a rotation shaft supporter 317. The rotation shaft supporter 317 is disposed in the third pipe member 313.

In some embodiments, the water-cooling heat dissipation device 1 of the present disclosure further includes a drive electric circuit board 50. The drive electric circuit board 50 is fastened at a top end of the rotor assembly 32 and electrically connected to the rotor assembly 32, thus the rotor assembly 32 is controlled to perform a liquid conveying function to make the water-cooling heat dissipation device 1 be operated.

In some embodiments, the water-cooling heat dissipation device 1 of the present disclosure further includes a first connector 60 and a second connector 70. The first connector 60 is correspondingly connected and in communication with the first pipe member 13. The second connector 70 is correspondingly connected and in communication with the second pipe member 312.

Figure 6:
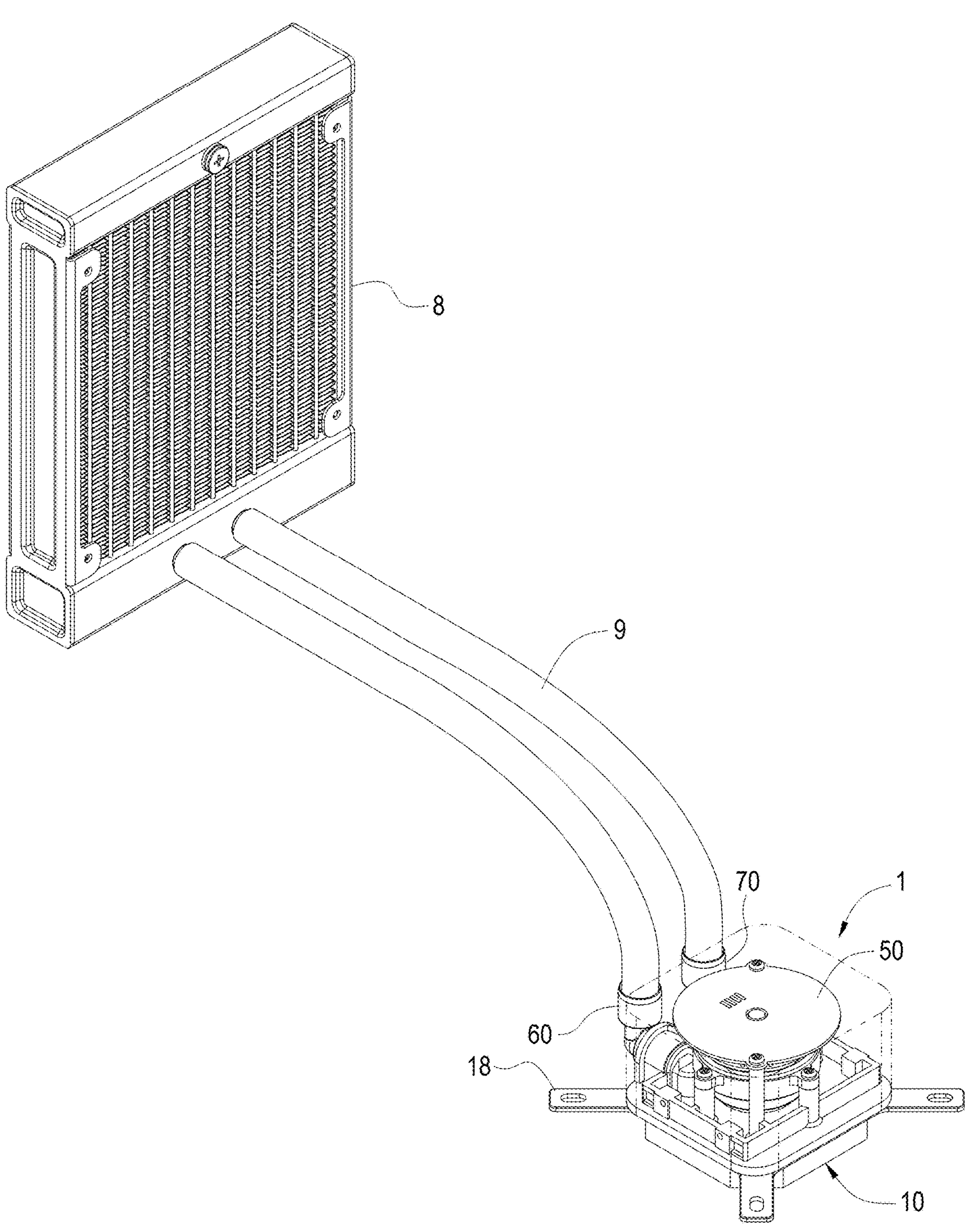
FIG. 6 is a schematic view showing the water-cooling heat dissipation device being applied in a water-cooling system according to the present disclosure.

Please refer to FIG. 6, the water-cooling heat dissipation device 1 of the present disclosure is applied in a water-cooling system. The water-cooling system mainly includes a water-cooling radiator 8 and two water transporting pipes 9. One of the water transporting pipes 9 is connected to the first connector 60 to be in communication with the water-cooling radiator 8. The other water transporting pipe 9 is connected to the second connector 70 to be in communication with the water-cooling radiator 8. Accordingly, a circular loop for heat dissipating is structured.

While this disclosure has been described by means of specific embodiments, numerous modifications and variations may be made thereto by those skilled in the art without departing from the scope and spirit of this disclosure set forth in the claims.

What is claimed is:

1. A water-cooling heat dissipation device (1), comprising:

a base (10), comprising an accommodation space (11), a heat exchanging chamber (12) and a first pipe member (13) communicating with the heat exchanging chamber (12), wherein a water conveying pipe (14) is disposed between and in communication with the accommodation space (11) and the heat exchanging chamber (12), and a circular slot (15) is defined on an outer periphery of the water conveying pipe (15);

a heat absorbing structure (20), connected to the base (10) and disposed in the heat exchanging chamber (12);

a liquid driving mechanism (30), connected to the base (10) and disposed in the accommodation space (10), and comprising a housing (31) and a rotor assembly (32), wherein the housing (31) comprises a compartment (311), a second pipe member (312) communicating with the compartment (311) and a third pipe member (313) communicating with the compartment (311), the rotor assembly (32) is disposed in the compartment (311), the third pipe member (313) is disposed in the circular slot (15) and in communication with the water conveying pipe (14); and a seal member (40), disposed in the circular slot (15) and comprising a bottom pad (41), an inner ring (42) and an outer ring (43) both extended from the bottom pad (41), wherein the seal member (40) is squeezed by the third pipe member (313) to generate a partial deformation to make the third pipe member (313) be combined with the water conveying pipe (14), the inner ring (42) is clamped between the water conveying pipe (14) and the third pipe member (313), the bottom pad (41) is abutted by the third pipe member (313), and the outer ring (43) is clamped between the third pipe member (43) and an inner wall of the circular slot (15).

2. The water-cooling heat dissipation device (1) according to claim 1, wherein the inner ring (42) comprises at least one inner side water stopping ring (421) disposed on one side thereof opposite to the outer ring (43).

3. The water-cooling heat dissipation device (1) according to claim 2, wherein the outer ring (43) comprises at least one outer side water stopping ring (431) disposed on one side thereof opposite to the inner ring (42).

4. The water-cooling heat dissipation device (1) according to claim 1, wherein the liquid driving mechanism (30) further comprises an anti-leaking ring (34), the housing (31) comprises an inner thread (316), the rotor assembly (32) comprises an outer thread (321), the anti-leaking ring (34) is clamped between the housing (31) and the rotor assembly (32), and the outer thread (321) is correspondingly threaded with the inner thread (316).

5. The water-cooling heat dissipation device (1) according to claim 1, further comprising a drive electric circuit board (50) fastened with the rotor assembly (32) and electrically connected to the rotor assembly (32).

6. The water-cooling heat dissipation device (1) according to claim 1, wherein the heat absorbing structure (20) comprises a heat conducting plate (21) and an inner cover (22) covering the heat conducting plate (21), the heat conducting plate (21) comprises a plurality of heat dissipating fins (211) arranged spacedly, and the inner cover (22) comprises an opening (221) corresponding to the water conveying pipe (14).

7. The water-cooling heat dissipation device (1) according to claim 1, wherein an insertion slot (17) is defined on an outer side of the base (10) to make a fastening rack (18) be mounted and connected.

8. The water-cooling heat dissipation device (1) according to claim 1, wherein the heat absorbing structure (20) comprises an abutting plane (PL), the rotor assembly (32) comprises a core extending line (L), and the core extending line (L) is arranged perpendicularly to the abutting plane (PL).

9. The water-cooling heat dissipation device (1) according to claim 1, wherein the first pipe member (13) and the base (10) are configured in one piece.

10. The water-cooling heat dissipation device (1) according to claim 1, wherein the second pipe member (312) and the housing (31) are configured in one piece.

* * * * *